(12) United States Patent
Chang et al.

(10) Patent No.: US 8,110,931 B2
(45) Date of Patent: Feb. 7, 2012

(54) WAFER AND SEMICONDUCTOR PACKAGE

(75) Inventors: Hsiao Chuan Chang, Kaohsiung (TW); Tsung Yueh Tsai, Kaohsiung County (TW); Yi Shao Lai, Yonghe (TW); Ho Ming Tong, Taipei (TW); Jian Cheng Chen, Tainan County (TW); Wei Chi Yih, Taichung (TW); Chang Ying Hung, Kaohsiung (TW); Cheng Wei Huang, Kaohsiung (TW); Chih Hsing Chen, Kaohsiung (TW); Tai Yuan Huang, Kaohsiung (TW); Chieh Ting Chen, Kaohsiung County (TW); Yi Tsai Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 243 days.

(21) Appl. No.: 12/501,246

(22) Filed: Jul. 10, 2009

(65) Prior Publication Data
US 2010/0007004 A1    Jan. 14, 2010

Related U.S. Application Data

(60) Provisional application No. 61/079,811, filed on Jul. 11, 2008.

(30) Foreign Application Priority Data

Sep. 5, 2008 (TW) .............................. 97134025 A
Oct. 16, 2008 (TW) .............................. 97139655 A

(51) Int. Cl.
    *H01L 23/48* (2006.01)
(52) U.S. Cl. ............... 257/780; 257/784; 257/E23.021; 257/E23.025
(58) Field of Classification Search ............... 257/780, 257/784, E23.021, E23.025
    See application file for complete search history.

(56) References Cited

U.S. PATENT DOCUMENTS

| 6,329,722 | B1 | 12/2001 | Shih et al. | |
| 7,404,513 | B2 * | 7/2008 | Kadoguchi et al. | 228/180.5 |
| 2008/0272487 | A1 * | 11/2008 | Shim et al. | 257/737 |
| 2009/0032947 | A1 * | 2/2009 | Na et al. | 257/738 |
| 2009/0221104 | A1 * | 9/2009 | Yamaguchi et al. | 438/15 |
| 2009/0236742 | A1 * | 9/2009 | Low | 257/737 |

FOREIGN PATENT DOCUMENTS

| CN | 1417848 | 5/2003 |
| CN | 1568543 | 1/2005 |
| CN | 1750257 | 3/2006 |
| CN | 1753159 | 3/2006 |
| CN | 1828890 | 9/2006 |
| CN | 1925146 | 3/2007 |
| CN | 101383335 | 3/2009 |
| JP | 57023246 | 2/1982 |
| JP | 8107123 | 4/1996 |
| TW | 200504902 | 2/2005 |

\* cited by examiner

*Primary Examiner* — Trung Q Dang

(57) ABSTRACT

A wafer defines a plurality of chips arranged in array manner. Each chip includes at least one aluminum pad and a middle material. The middle material covers the aluminum pad and is mounted on the aluminum pad.

21 Claims, 17 Drawing Sheets

WAFER AND SEMICONDUCTOR PACKAGE

CROSS REFERENCE TO RELATED APPLICATION

This application claims the priority benefit of U.S. Patent Application Ser. No. 61/079,811, filed on Jul. 11, 2008, Taiwan Patent Application Serial Number 097139655, filed on Sep. 5, 2008, Taiwan Patent Application Serial Number 097134025, filed on Oct. 16, 2008, the full disclosure of which is incorporated herein by reference.

BACKGROUND OF THE INVENTION

1. Field of the Invention

The present invention generally relates to a semiconductor package, and more particularly to a wire bonding structure of a semiconductor package, wherein a middle material is located between a copper bonding wire and an aluminum pad so as to be acted as a buffer during the pressing process, whereby the force resulted from the copper bonding wire cannot damage the structure of the aluminum pad during the pressing process.

2. Description of the Related Art

Referring to FIG. 1, according to a process for manufacturing a semiconductor package, the technology of wire bonding method widely applied to the electrical connection between a pad 11 of a chip 10 and a pad 13 of a substrate 12 by using a bonding wire 14. Wire binding process is mainly based on gold (Au) wires, but copper (Cu) wire has an advantage of low cost. Compared with the gold, the copper has better electric conductivity and thermal conductivity, whereby the copper bonding wire has smaller diameter of wire and better dissipation of heat. However, the copper has disadvantage of insufficient ductility and easy oxidation such that the utilization of the copper bonding wire is restricted.

Recently, the copper bonding wire is only applied to a chip pad with a big size or a chip pad of low dielectric material (low-k) of wafer, because the success of the wire bonding process of the copper bonding wire depends on the structural strength of the chip pad. In order to avoid the failure of the wire bonding process of the copper bonding wire, the small size of the chip pad will be limited.

Referring to FIGS. 2 to 4, they depict a conventional method for bonding a copper bonding wire. Referring to FIG. 2, a copper bonding wire 20 is provided by a wire bonding machine, wherein the copper bonding wire 20 has a copper line 22 and a copper ball 24. The copper ball 24 is physically connected to an end of the copper line 22 by a discharging electricity manner or a burning hydrogen manner. Referring to FIG. 3, the copper ball 24 is pressed and then deformed. Referring to FIG. 4, the deformed copper ball 24 is bonded to an aluminum (Al) pad 32 by a vibration process. However, the hardness of the copper is higher than that of the aluminum, and thus the force resulted from the copper bonding wire 20 possibly damages the structure of the aluminum pad 32 during the pressing process. Furthermore, an inter-metallic compound (IMC) is formed between the aluminum pad 32 and the copper bonding wire 20, and the quantity of IMC is insufficient. Thus, the wire bonding structure in the prior art has less bonding force and further has lower reliability.

Referring to FIG. 5, U.S. Pat. No. 6,329,722 B1, entitled "Bonding Pads for Integrated Circuits Having Copper Interconnect Metallization", discloses that a device having a thin metallic coating 70 (e.g. tin) which forms strong bonds to copper is provided on the pads 60 of an integrated circuit having copper metallization. The surface oxidation of the thin metallic coating 70 is self limited, and the oxides are readily removed. Furthermore, the pad 60 having the thin metallic coating 70 forms intermetallics at low temperature, thereby making the pad 60 both solderable and compatible with a bonding wire 80.

Although the tin metallic coating can form intermetallics at low temperatures, it is necessary to consider the oxidation problem of the pad made of copper in the prior art, e.g. the tin metallic coating must cover the whole exposed area of the copper pad so as to avoid the oxidation of the copper pad.

Accordingly, there exists a need for a wire bonding structure of a semiconductor package capable of solving the above-mentioned problems.

SUMMARY OF THE INVENTION

It is an object of the present invention to provide a wire bonding structure of a semiconductor package, wherein a middle material is located between a copper bonding wire and a aluminum pad so as to be acted as a buffer during the pressing process, whereby the force resulted from the copper bonding wire cannot damage the structure of the aluminum pad during the pressing process.

In order to achieve the foregoing object, the present invention provides a wire bonding structure of a semiconductor package including an aluminum pad, a middle material and a copper bonding wire. The middle material covers the aluminum pad and is mounted on the aluminum pad. The copper bonding wire is bonded to the middle material.

According to the method for bonding a copper bonding wire of the present invention, the middle material is located between the copper bonding wire and the aluminum pad so as to be acted as a buffer during the pressing process, and thus the force resulted from the copper bonding wire cannot damage the structure of the aluminum pad during the pressing process. Furthermore, according to the wire bonding structure of the present invention, the bonding force between the middle material and the copper bonding wire and the bonding force between the middle material and the aluminum pad are greater than that between the aluminum pad and the copper bonding wire so as to have higher reliability.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
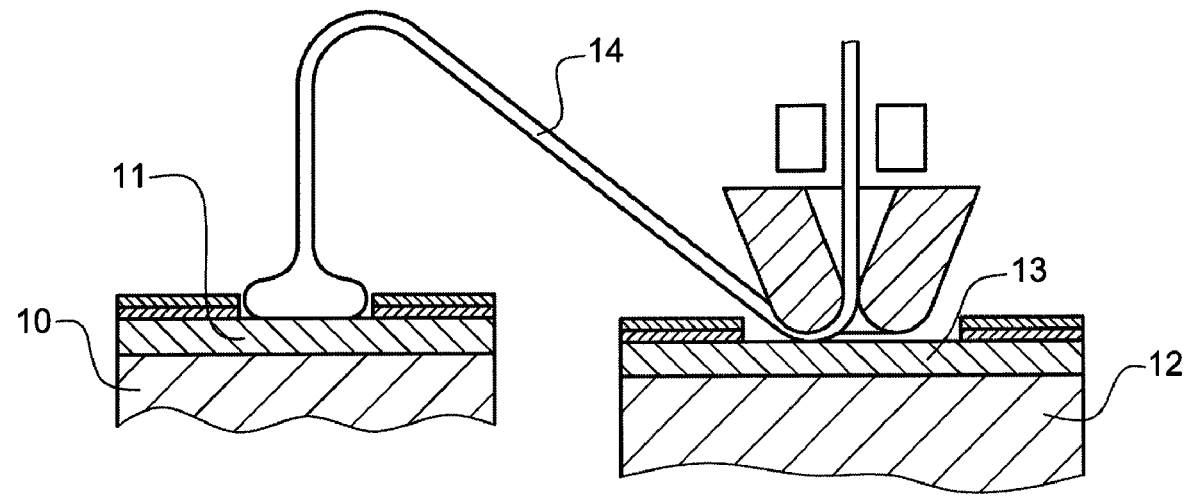
FIG. 1 is a cross-sectional views showing a method for bonding a wire in the prior art.
Figure 2:
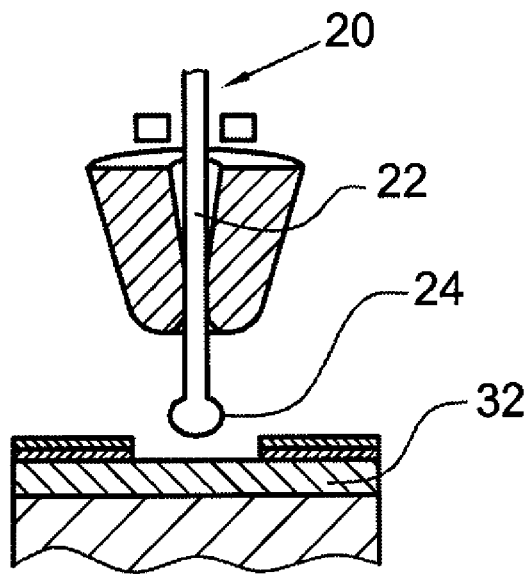
FIGS. 2 to 4 are cross-sectional views showing a method for bonding a copper bonding wire in the prior art.
Figure 3:
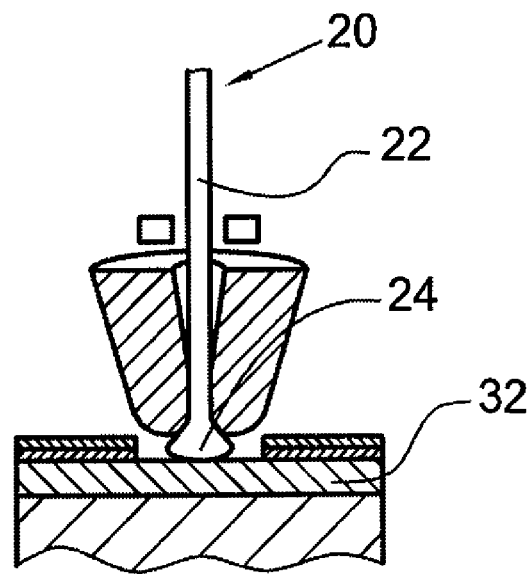
Figure 4:
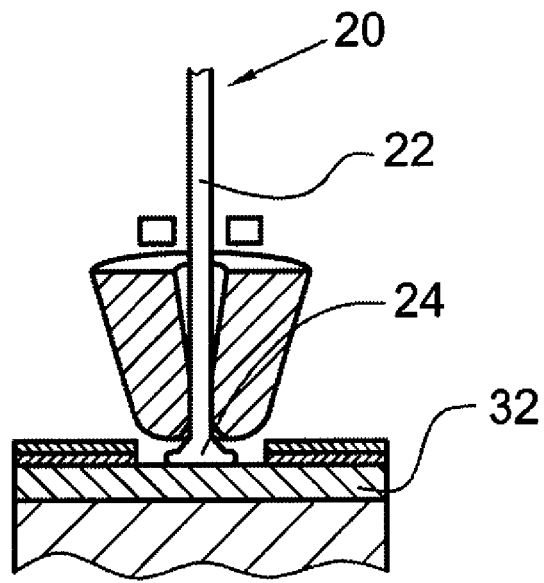
Figure 5:
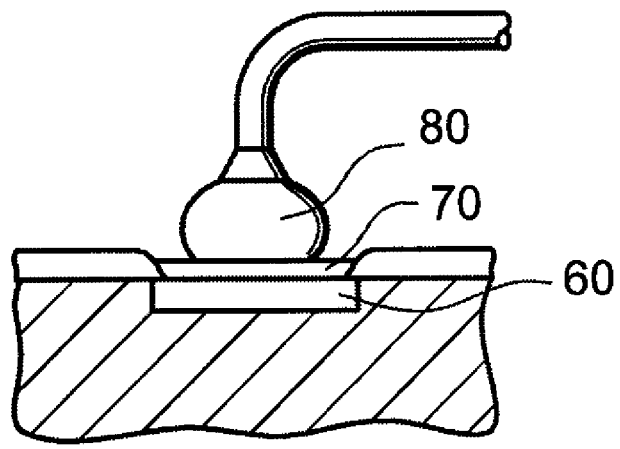
FIG. 5 is a cross-sectional view showing a wire bonding structure in the prior art.
Figure 6:
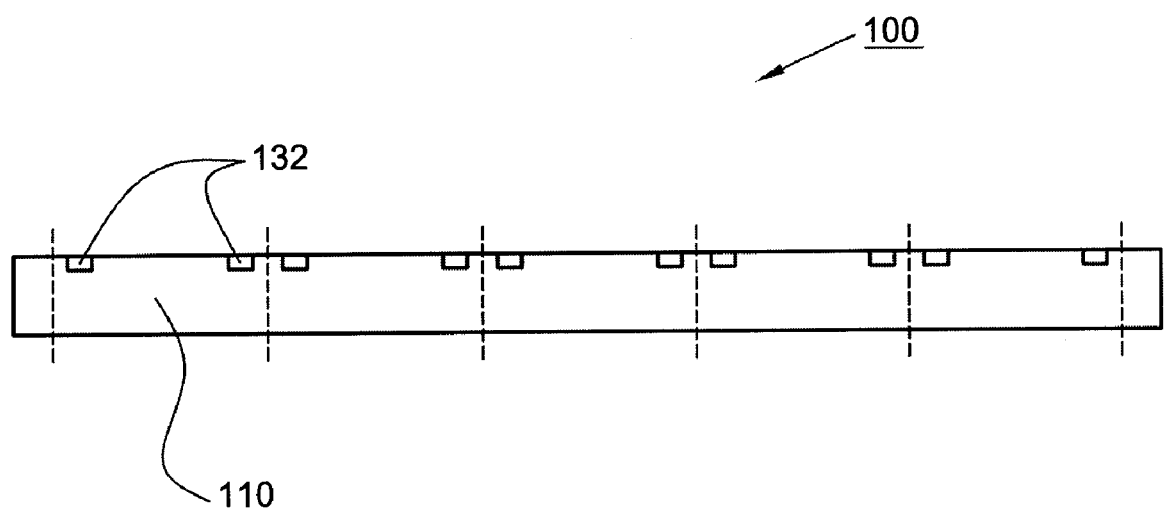
FIGS. 6 to 9 are cross-sectional views showing a method for manufacturing a chip according to the first embodiment of the present invention.
Figure 7:
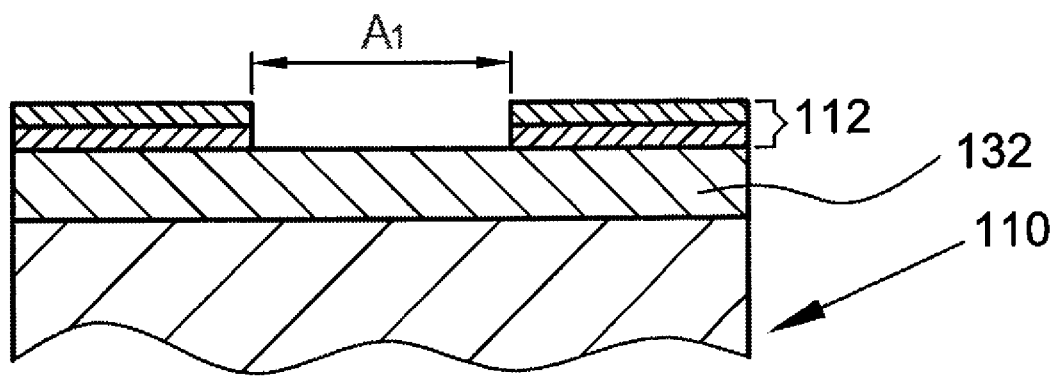
Figure 8:
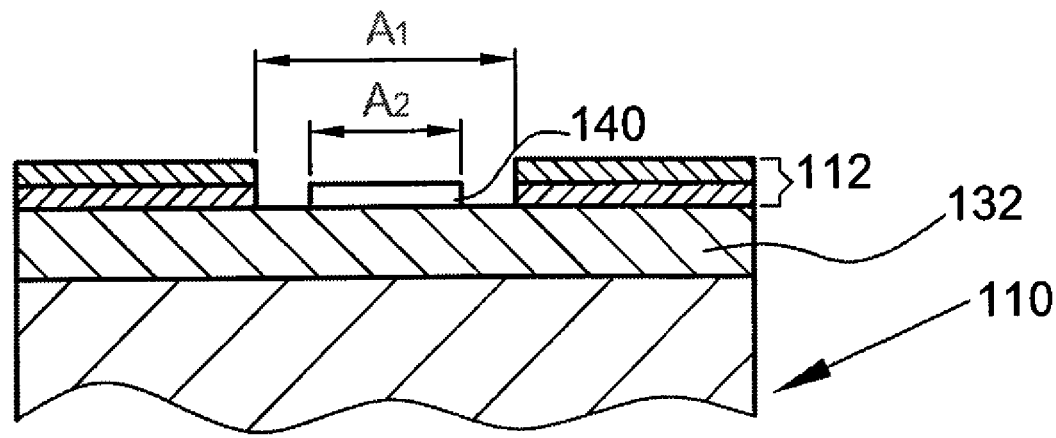

Referring to FIGS. 6-9, they depict a method for manufacturing a chip according to the first embodiment of the present invention. Referring to FIG. 6, a wafer 100 is provided, wherein the wafer 100 defines a plurality of chips 110 arranged in array manner. Referring to FIG. 7, it depicts a partially expanded cross-section of the chip of the present invention showing that each chip 110 includes a passivating layer 112 and at least one aluminum pad 132. The passivating layer 112 covers the aluminum pad 132 and exposes a part of the aluminum pad 132, whereby the aluminum pad 132 has an outer area A1. Referring to FIG. 8, a middle material 140 covers the aluminum pad 132 and is mounted on the aluminum pad 132. The thickness of the middle material 140 is approximately between 0.1 and 10 mil.

In this embodiment, the middle material 140 covers the aluminum pad 132 and is mounted on the aluminum pad 132 by an electroplate process. In another embodiment, the middle material 140 covers the aluminum pad 132 and is mounted on the aluminum pad 132 by a sputtering process. In a further embodiment, the middle material 140 covers the aluminum pad 132 and is mounted on the aluminum pad 132 by a printing process.

Since the aluminum pad 132 has no oxidation problem to be solved, it is not necessary that the middle material 140 covers the whole outer area A1 of the aluminum pad 132 exposed from the passivating layer 112. Preferably, the covering area A2 of the aluminum pad 132 covered by the middle material 140 can be smaller than 99% of the outer area A1 of the aluminum pad 132. Simultaneously, the quantity of the middle material 140 can be saved. Furthermore, the covering area A2 of the aluminum pad 132 covered by the middle material 140 must be big enough to bond a bonding wire, and thus the covering area A2 of the aluminum pad 132 covered by the middle material 140 can be bigger than 30% of the outer area A1 of the aluminum pad 132.

Figure 9:
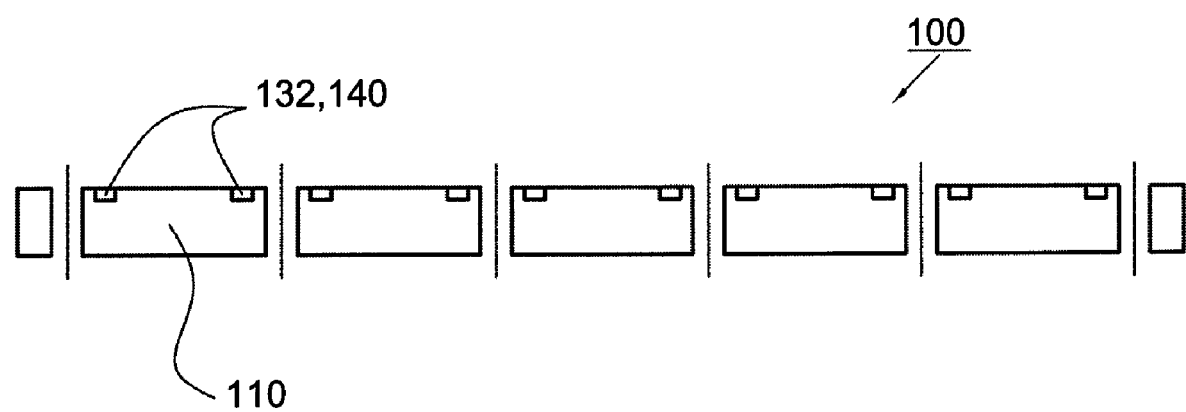

Referring to FIG. 9, the wafer 100 is sawed to a plurality of chips 110 so as to form the chip 110 having the aluminum pad 132 and the middle material 140 of the present invention.

Figure 10:
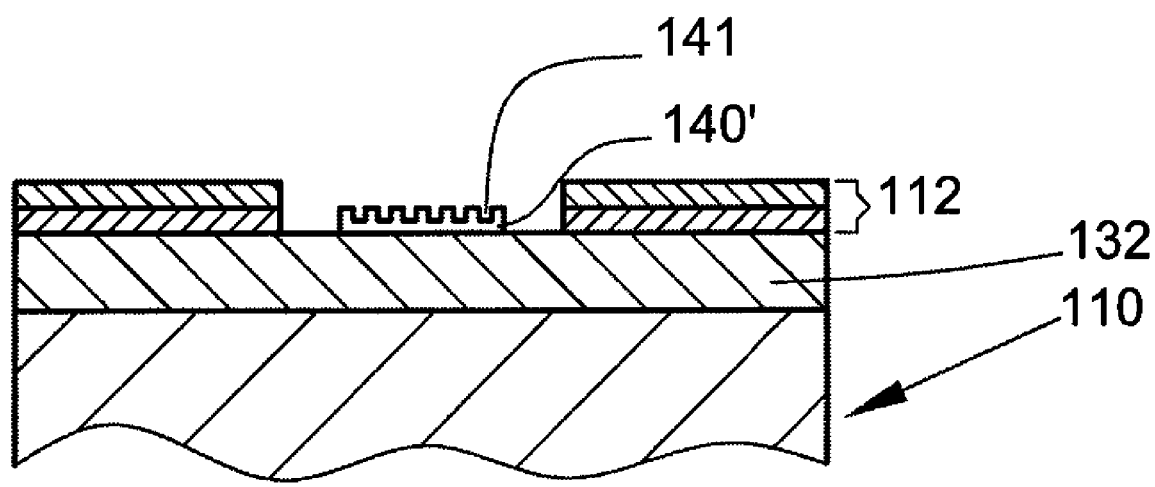
FIG. 10 is a cross-sectional view showing a method for manufacturing a chip according to an alternative embodiment of the present invention.
Figure 11A:
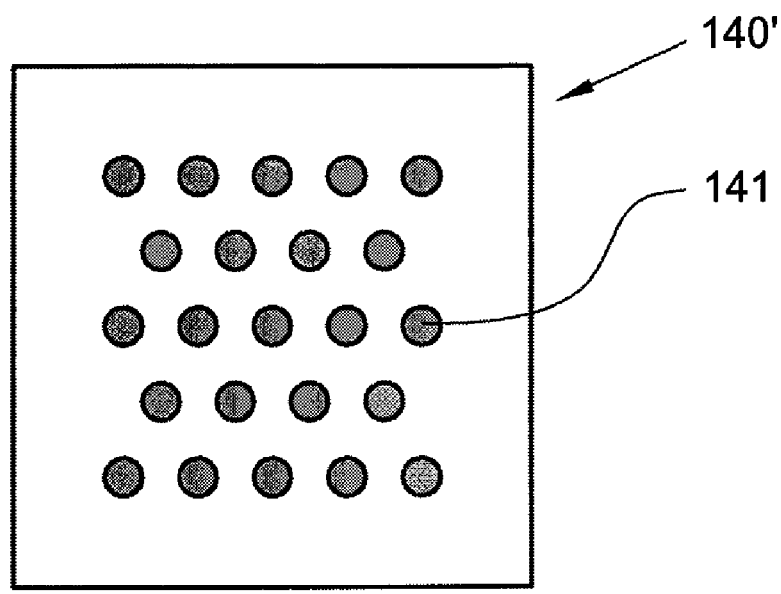
FIGS. 11a and 11b are plane views of the middle material of the present invention.
Figure 11B:
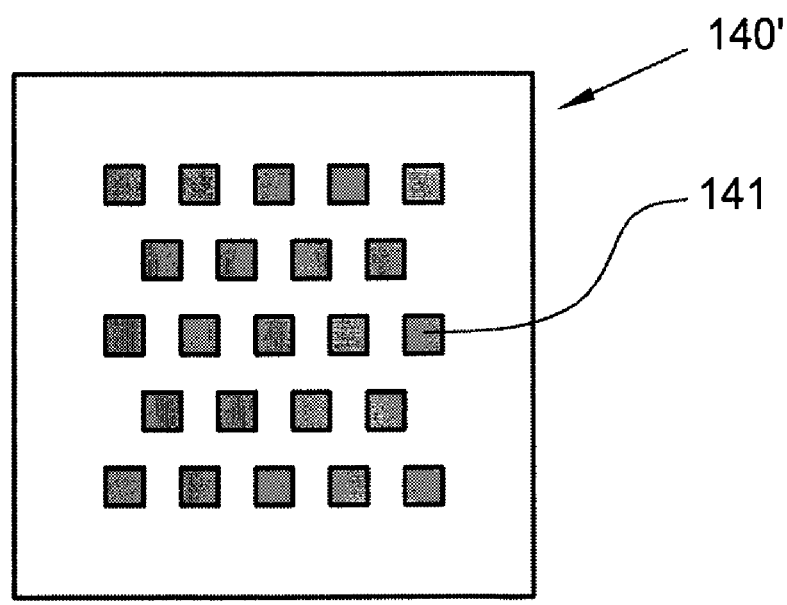
Figure 12A:
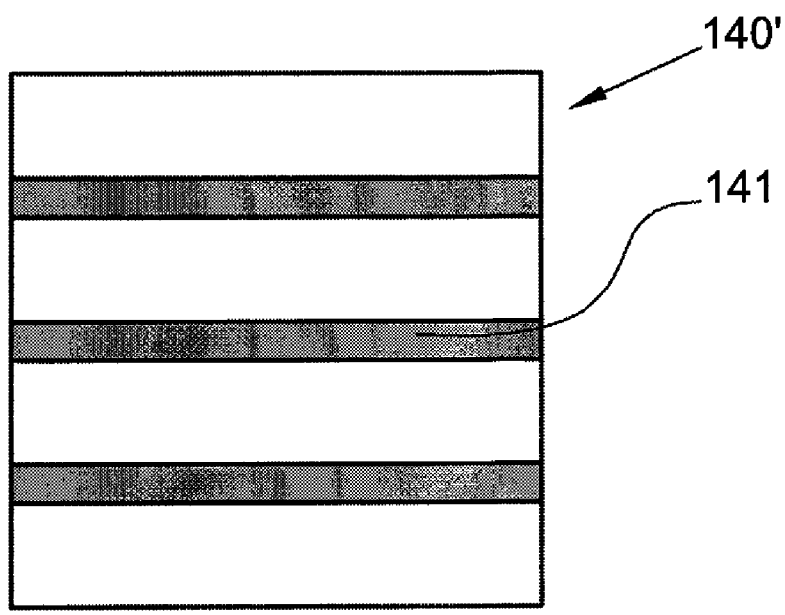
FIGS. 12a and 12b are plane views of another middle material of the present invention.
Figure 12B:
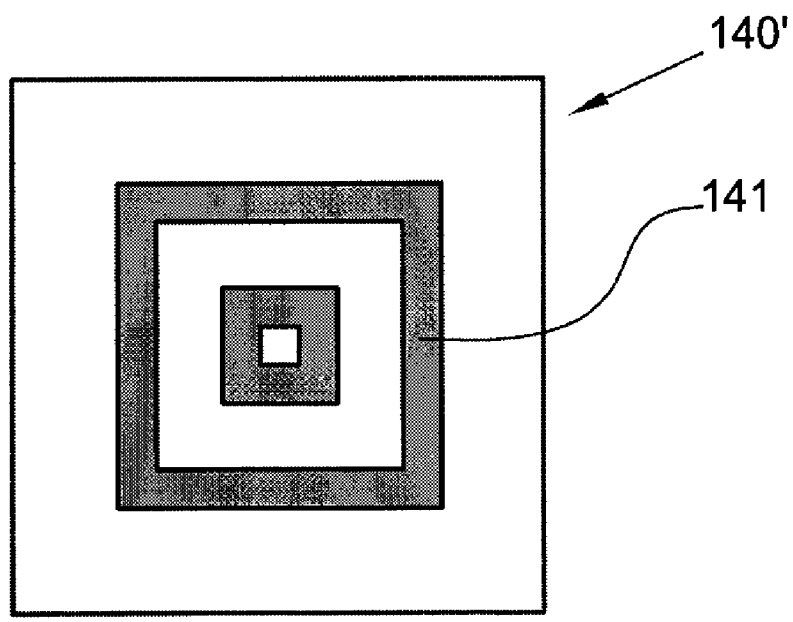
Figure 13A:
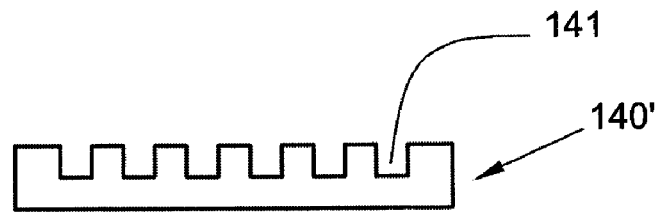
FIGS. 13a to 13d are cross-sectional views of the middle material of the present invention.
Figure 13B:
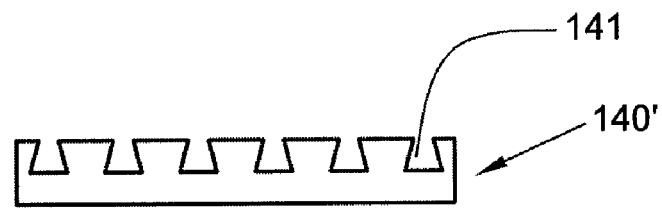
Figure 13C:
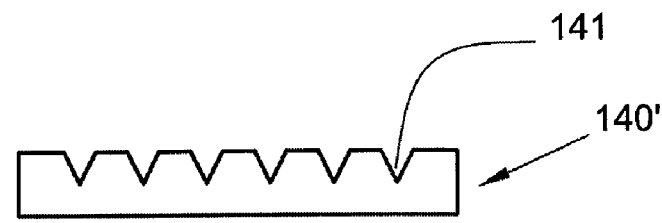
Figure 13D:
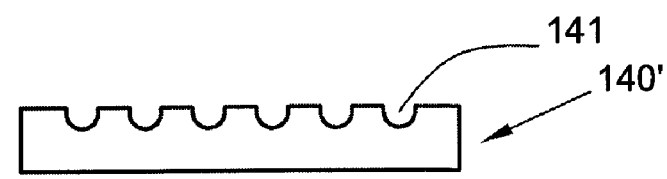

In addition, referring to FIG. 10, in an alternative embodiment, the method for manufacturing the chip of the present invention can further include the follow step. At least one first pattern 141 is formed on a top surface of the middle material 140' so as to form the chip 110 having the aluminum pad 132 and the patterned middle material 140' of the present invention. In this embodiment, the first pattern 141 can be formed on the top surface of the middle material 140' by photolithography and etching processes. In another embodiment, the first pattern 141 can be formed on the top surface of the middle material 140' by a laser drilling process. In a further embodiment, the first pattern 141 can be formed on the top surface of the middle material 140' by a mechanically drilling process. Referring to FIGS. 11a and 11b, they show plane views of the middle material 140'. The first pattern 141 can be a cavity, e.g. circular or rectangular cavity. The depth of the cavity is smaller than the thickness of the middle material 140'. Referring to FIGS. 12a and 12b, they show plane views of another middle material 140'. The first pattern 141 can be a trench, e.g. straight or annular trench. Referring to FIGS. 13a to 13d, they show cross-sectional views of the middle material 140'. The cross-section of the middle material 140' can be rectangular, trapezoid, triangular or curved.

Figure 14:
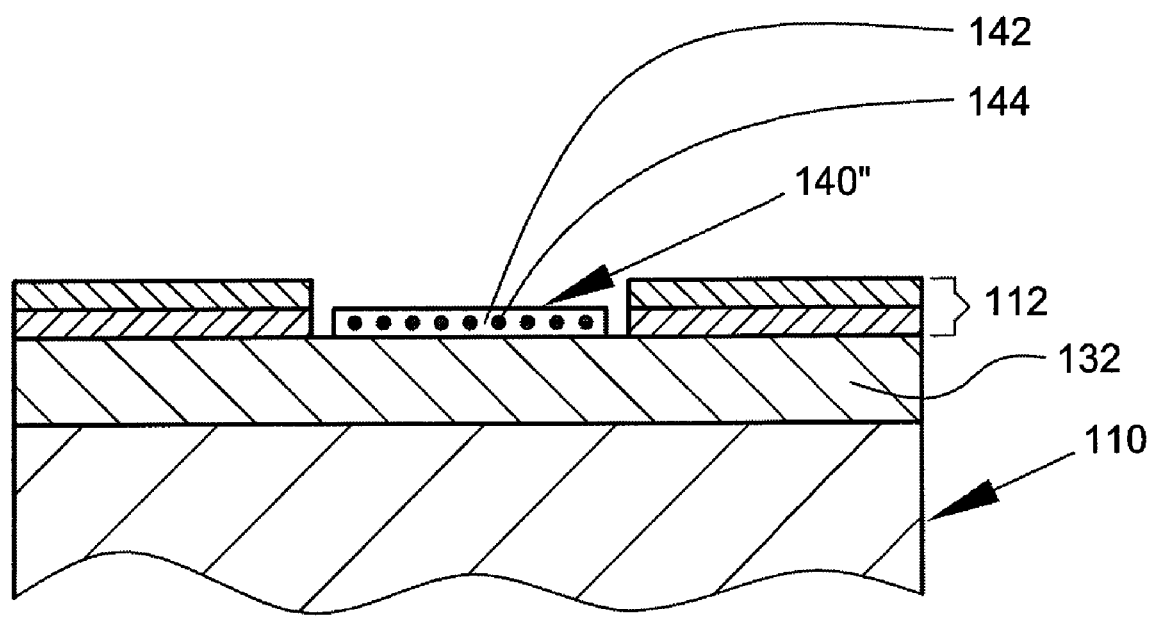
FIG. 14 is a cross-sectional view showing a method for manufacturing a chip according to the second embodiment of the present invention.

Referring to FIG. 14, it depicts a method for manufacturing a chip according to the second embodiment of the present invention. The method for manufacturing a chip according to the second embodiment is substantially similar to the method for manufacturing a chip according to the first embodiment, wherein the same elements are designated with the same reference numerals. The difference between the first and second embodiments is that the middle material 140" in the second embodiment includes an adhesive layer 142 and a plurality of electrically conductive particles 144 disposed in the adhesive layer 142. The middle material 140" covers the aluminum pad 132 and is mounted on the aluminum pad 132 by a coating process. The electrically conductive particles 144 can be spherical and made of metal. Or, the middle material 140" can be an anisotropic conductive film (ACF), wherein the electrically conductive particles 144 are only electrically connected in direction of pressing.

Figure 15:
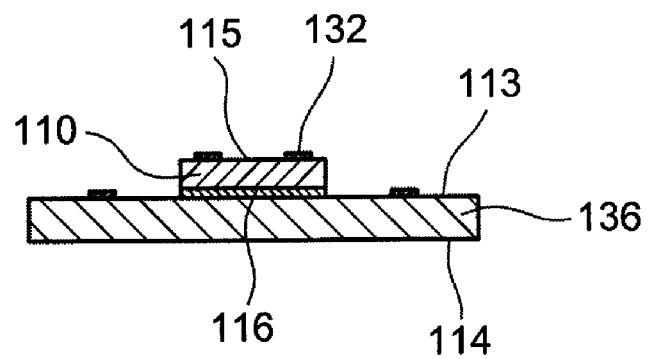
FIGS. 15 to 19 are cross-sectional views showing a method for packaging a semiconductor package according to the first embodiment of the present invention.

Referring to FIGS. 15 to 19, they depict a method for a packaging a semiconductor package according to the first embodiment of the present invention. Referring to FIG. 15, a carrier 136 is provided, wherein the carrier 136 has an upper surface 113 and a lower surface 114 opposite to the upper surface 113. A chip 110 is disposed on the carrier 136, wherein the chip 110 has an active surface 115 and a back surface 116 opposite to the active surface 115, and the back surface 116 of the chip 110 is located on the upper surface 113 of the carrier 136. The chip 110 includes the aluminum pad 132 and the middle material 140 of the present invention, shown in FIG. 8. The aluminum pad 132 is disposed on the active surface 115, and the middle material 140 covers the aluminum pad 132 and is mounted on the aluminum pad 132.

Figure 16:
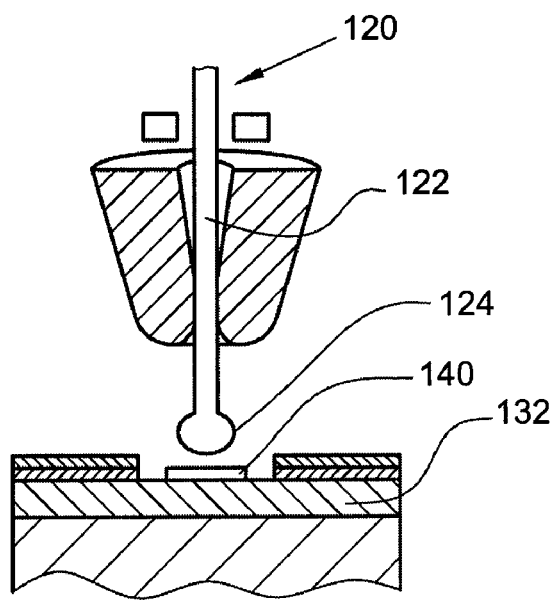

Referring to FIG. 16, a copper bonding wire 120 is provided by a wire bonding machine 102, wherein the copper bonding wire 120 has a line portion 122 and a block portion 124, wherein the block portion 124 is physically connected to an end of the line portion 122, and the cross-sectional area of the block portion 124 is bigger than that of the line portion 122. For example, the block portion 124 is physically connected to the end of the line portion 122 by a discharging electricity manner or a burning hydrogen manner.

Figure 17:
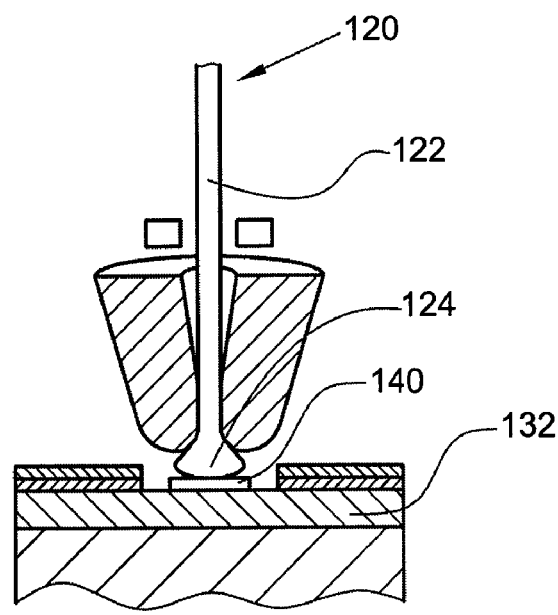

Referring to FIG. 17, the block portion 124 contact the middle material 140, and the block portion 124 is pressed and then deformed by a pressing process. The middle material 140 is located between the block portion 124 and the aluminum pad 132 so as to be acted as a buffer during the pressing process, and thus the force resulted from the block portion 124 cannot damage the structure of the aluminum pad 132 during the pressing process.

Figure 18:
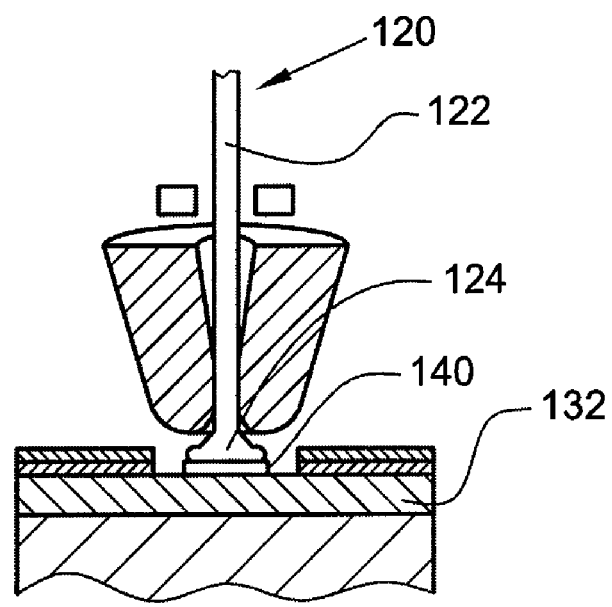

Referring to FIG. 18, the block portion 124 of the copper bonding wire 120 is bonded to the middle material 140 by a vibration process, so as to finish a method for bonding a bonding wire of the present invention and form a wire bonding structure of the present invention.

Figure 19:
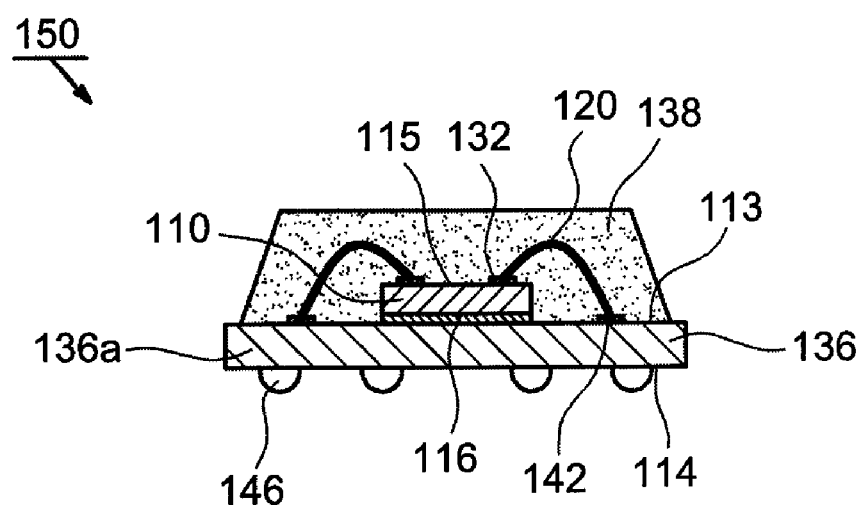

In addition, the carrier 136 can be a substrate or a leadframe. Referring to FIG. 19, in this embodiment, the carrier 136 can be a substrate 136a. The middle material 140 and the aluminum pad 132 of the present invention can be viewed as a chip pad, one end of the copper bonding wire 120 is electrically connected to the chip pad, and the other end of the copper bonding wire 120 is electrically connected to a substrate pad 142. The chip pad is electrically connected to the circuit of the chip. The substrate 136a includes external electrical contacts 146 located on the second surface 114.

Referring to FIG. 19 again, finally the chip 110, the copper bonding wire 120 are sealed and the carrier 136 is covered by a molding compound 138 so as to form a package, i.e. a semiconductor package 150 of the present invention.

In this embodiment, the middle material 140 can be selected from the group consisting of tin (Sn), gold (Au), zinc (Zn), platinum (Pt), palladium (Pd), manganese (Mn), magnesium (Mg), indium (In), germanium (Ge) and silver (Ag). The quantity of the inter-metallic compound (IMC) formed between the middle material 140 and the copper bonding wire 120 is more than that formed between the aluminum pad 132 and the copper bonding wire 120, and the quantity of the inter-metallic compound (IMC) formed between the middle material 140 and the aluminum pad 132 is more than that formed between the aluminum pad 132 and the copper bonding wire 120. Thus, the bonding force between the middle material 140 and the copper bonding wire 120 is more than that between the aluminum pad 132 and the copper bonding wire 120, and the bonding force between the middle material 140 and the aluminum pad 132 is more than that between the aluminum pad 132 and the copper bonding wire 120.

In an alternative embodiment, the middle material 140 can be also selected from single one or over one of the group consisting of nickel (Ni), vanadium (V), aluminum (Al), copper (Cu), titanium (Ti), tin (Sn), gold (Au), zinc (Zn), platinum (Pt), palladium (Pd), manganese (Mn), magnesium (Mg), indium (In), germanium (Ge) and silver (Ag). The middle material 140 can be an alloy. The composition of preferable alloy is Ni/Pd/Au alloy, Ni/Pd alloy, Al/Ni/Cu alloy, Ti/Ni/Cu alloy, Ti/Cu alloy or Cu/Sn alloy.

According to the method for bonding a copper bonding wire of the present invention, the middle material is located between the copper bonding wire and the aluminum pad so as to be acted as a buffer during the pressing process, and thus the force resulted from the copper bonding wire cannot damage the structure of the aluminum pad during the pressing process. Furthermore, according to the wire bonding structure of the present invention, the bonding force between the middle material and the copper bonding wire and the bonding force between the middle material and the aluminum pad are greater than that between the aluminum pad and the copper bonding wire so as to have higher reliability.

Figure 20:
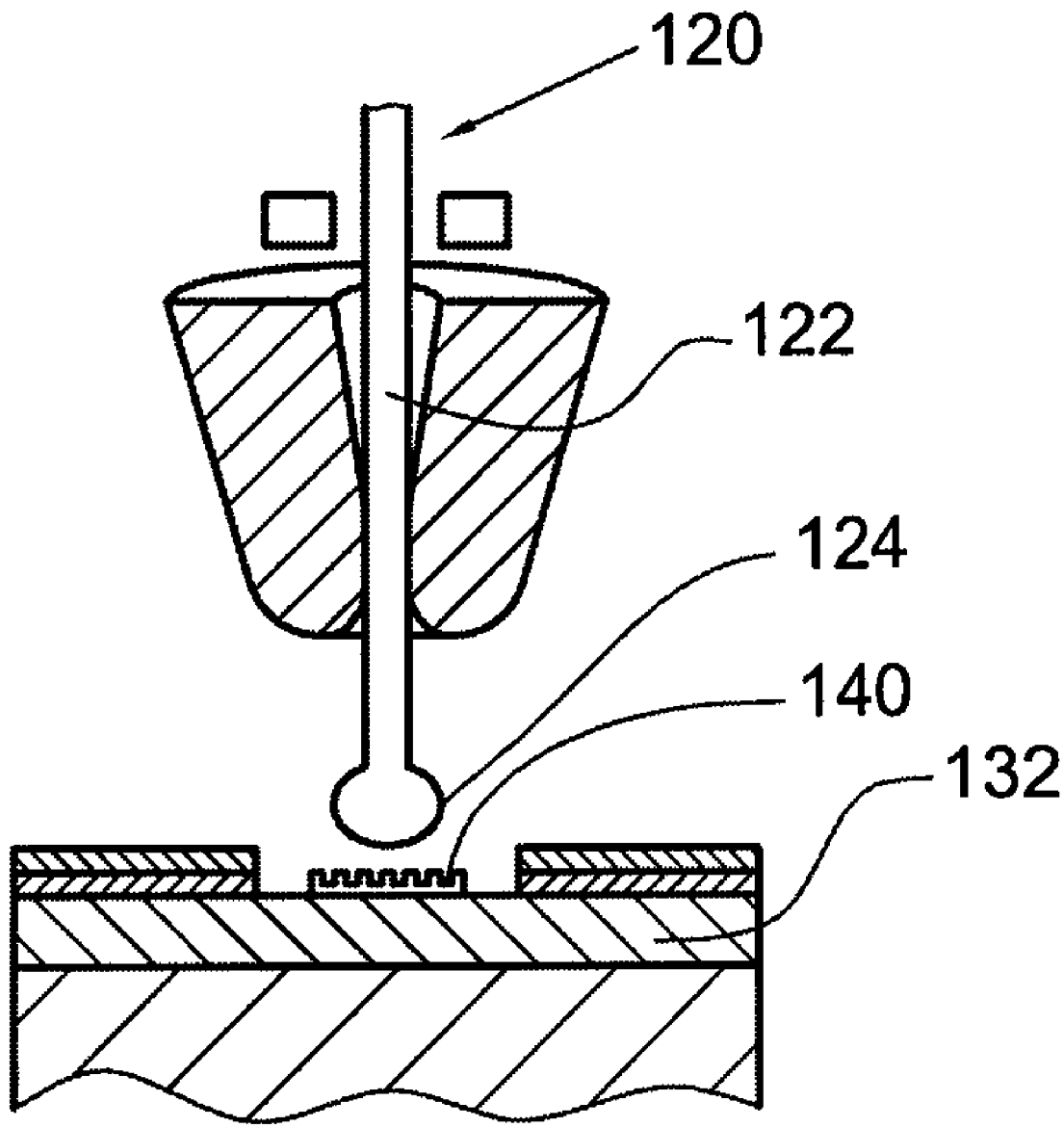
FIGS. 20 to 22 are cross-sectional views showing a method for bonding a copper bonding wire according to a method for packaging a semiconductor package in the second embodiment of the present invention.
Figure 21:
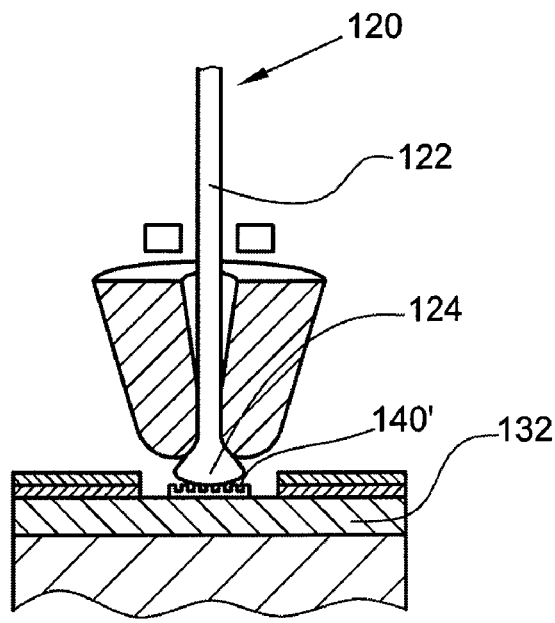
Figure 22:
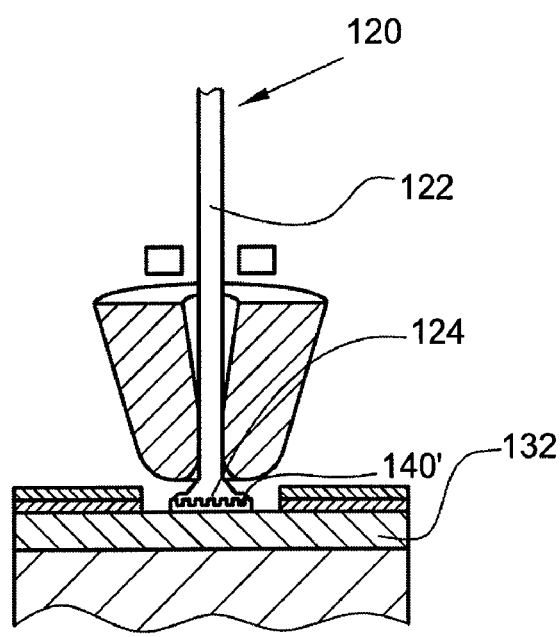

Referring to FIGS. 20 to 22, they depict a method for bonding a bonding wire according to a method for packaging a semiconductor package in the second embodiment of the present invention. The method for bonding a bonding wire according to the second embodiment is substantially similar to the method for bonding a bonding wire according to the first embodiment, wherein the same elements are designated with the same reference numerals. The difference between the first and second embodiments is that the chip 110 having the aluminum pad 132 and the patterned middle material 140' of the present invention is provided in the second embodiment, shown in FIG. 10. The patterned middle material 140' covers the aluminum pad 132 and is mounted on the aluminum pad 132.

Referring to FIG. 20, a copper bonding wire 120 is provided by a wire bonding machine 102, wherein the copper bonding wire 120 has a line portion 122 and a block portion 124, wherein the block portion 124 is physically connected to an end of the line portion 122, and the cross-sectional area of the block portion 124 is bigger than that of the line portion 122.

Referring to FIG. 21, the block portion 124 contact the patterned middle material 140', and the block portion 124 is pressed and then deformed by a pressing process. The patterned middle material 140' is located between the block portion 124 and the aluminum pad 132 so as to be acted as a buffer during the pressing process, and thus the force resulted from the block portion 124 cannot damage the structure of the aluminum pad 132 during the pressing process.

Referring to FIG. 22, the block portion 124 of the copper bonding wire 120 is bonded to the patterned middle material 140' by a vibration process, so as to form a wire bonding structure of the present invention.

Figure 23:
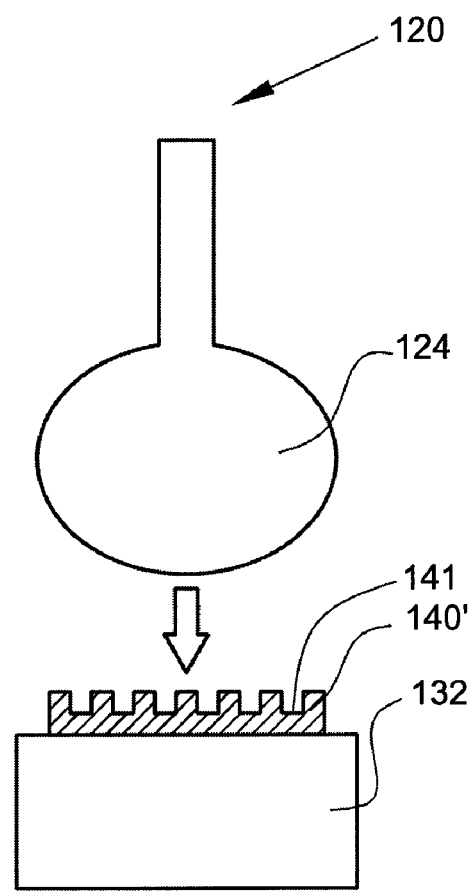
FIGS. 23 to 24 are cross-sectional views of a copper bonding wire and an aluminum pad showing that a block portion of the copper bonding wire is bonded to a middle material located on the aluminum pad.
Figure 24:
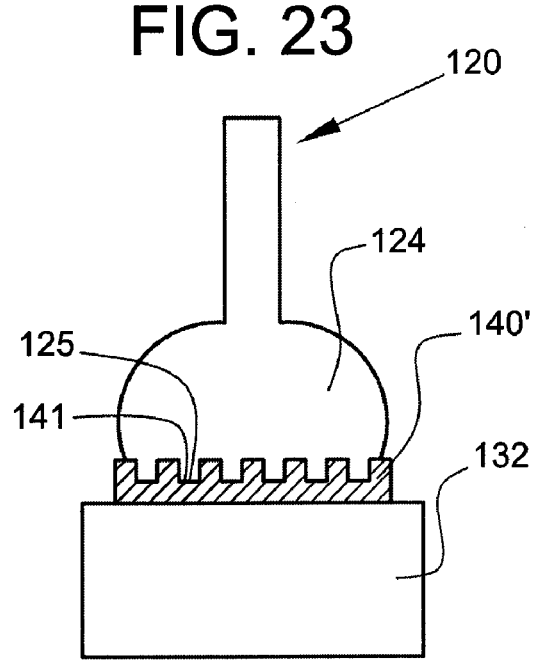

Referring to FIGS. 23 and 24, if the hardness of the patterned middle material 140' is more than that of the block portion 124 of the copper bonding wire 120 when the block portion 124 is bonded to the patterned middle material 140', at least one second pattern 125 is formed on a bottom surface of the block portion 124 of the copper bonding wire 120 by the first pattern 141 on the top surface of the patterned middle material 140', and the second pattern 125 is bonded to the first pattern 141. Thus, the bonding area between the patterned middle material 140' located on the aluminum pad 132 and the copper bonding wire 120 can be increased, i.e. the bonding area between the aluminum pad 132 and the copper bonding wire 120 is bigger.

According to the method for bonding a bonding wire of the present invention, the middle material is located between the copper bonding wire and the aluminum pad so as to be acted as a buffer during the pressing process, and thus the force resulted from the copper bonding wire cannot damage the structure of the aluminum pad during the pressing process. Furthermore, according to the wire bonding structure of the present invention, the bonding force between the middle material and the copper bonding wire and the bonding force between the middle material and the aluminum pad are greater than that between the aluminum pad and the copper bonding wire so as to have higher reliability. In addition, according to the wire bonding structure of the present invention, the bonding area between the patterned middle material located on the aluminum pad and the copper bonding wire is bigger, i.e. the bonding force between the aluminum pad and the copper bonding wire is greater so as to keep sufficient bonding force.

Figure 25:
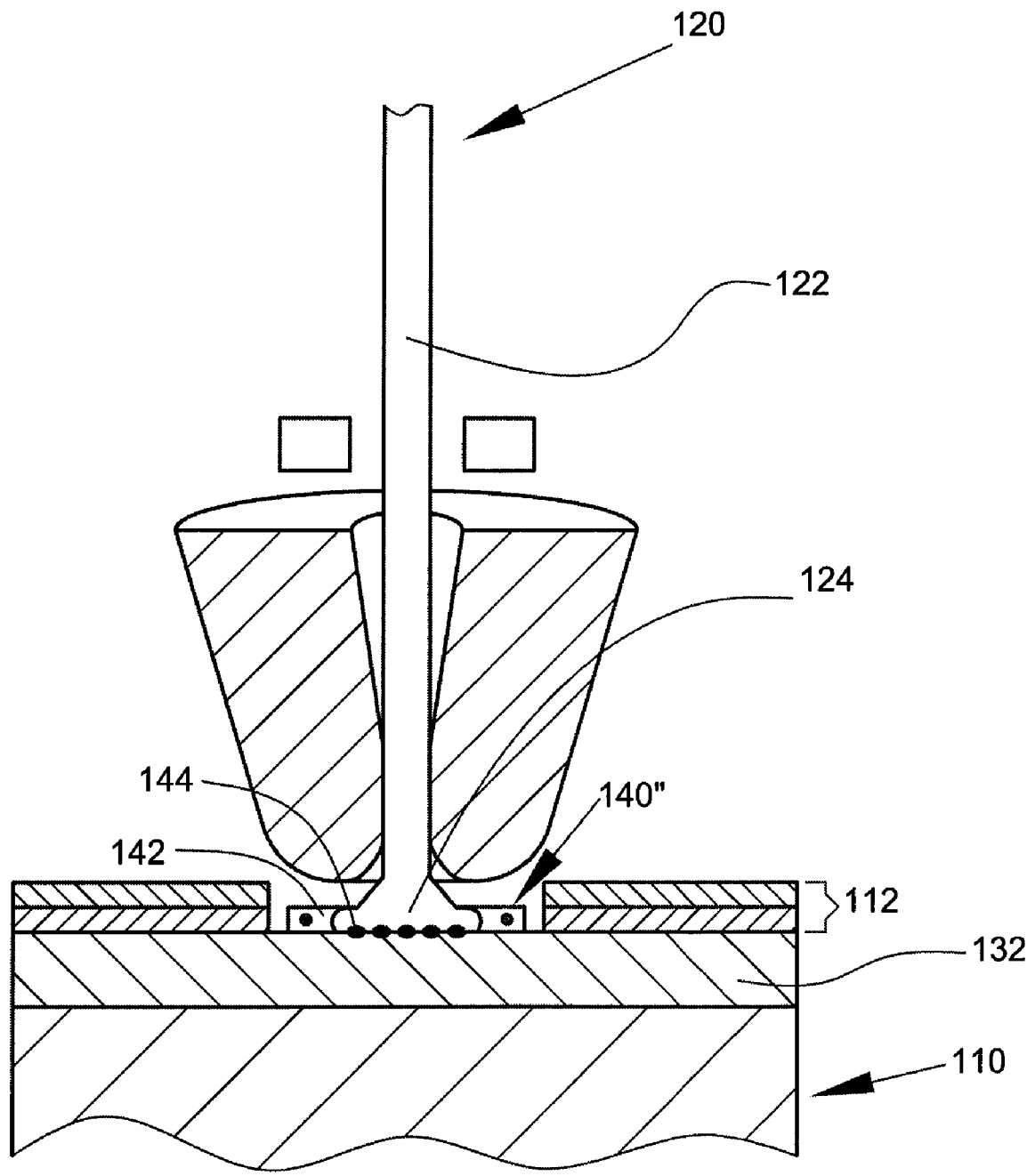
FIG. 25 is a cross-sectional view showing a method for bonding a copper bonding wire according to a method for packaging a semiconductor package in the third embodiment of the present invention.

Referring to FIG. 25, it depicts a method for bonding a bonding wire according to a method for packaging a semiconductor package in the third embodiment of the present invention. The method for bonding a bonding wire according to the third embodiment is substantially similar to the method for bonding a bonding wire according to the first embodiment, wherein the same elements are designated with the same reference numerals. The difference between the first and third embodiments is that the chip 110 having the aluminum pad 132 and the middle material 140" of the present invention is provided in the third embodiment, shown in FIG. 14.

In this embodiment, according to the method for bonding a bonding wire of the present invention, the middle material 140" is coated on the aluminum pad 132, i.e. an adhesive layer 142 and a plurality of electrically conductive particles 144 are coated on the aluminum pad 132. When the block portion 124 of the copper bonding wire 120 is bonded to the aluminum pad 132, the electrically conductive particles 144 is located between the block portion 124 and the aluminum pad 132 for electrical connection, and the adhesive layer 142 can increase the bond between the block portion 124 and the aluminum pad 132.

The method for bonding a bonding wire of the present invention can improve the bond and electrical connection between the block portion and the aluminum pad. According to the method for bonding a bonding wire of the present invention, the copper bonding wire is bonded to the aluminum pad by only using lower power, and thus it avoids the crack and aluminum extrusion of the aluminum pad.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package comprising:
   a carrier;
   a chip disposed on the carrier, wherein the chip has a first surface and a second surface opposite to the first surface;
   an aluminum pad disposed on the first surface of the chip;
   a middle material covering the aluminum pad and mounted on the aluminum pad, wherein the middle material is selected from the group consisting of nickel (Ni), vanadium (V) and titanium (Ti);
   a copper bonding wire bonded to the middle material; and
   a molding compound for sealing the chip and the copper bonding wire and covering the carrier.

2. The semiconductor package as claimed in claim 1, wherein the middle material is selected from the group consisting of tin (Sn), gold (Au), zinc (Zn), platinum (Pt), palladium (Pd), manganese (Mn), magnesium (Mg), indium (In), germanium (Ge) and silver (Ag).

3. The semiconductor package as claimed in claim 1, wherein the middle material is an alloy selected from over one of the group consisting of nickel (Ni), vanadium (V), aluminum (Al), copper (Cu), titanium (Ti), tin (Sn), gold (Au), zinc (Zn), platinum (Pt), palladium (Pd), manganese (Mn), magnesium (Mg), indium (In), germanium (Ge) and silver (Ag).

4. The semiconductor package as claimed in claim 3 wherein the alloy selected from the group consisting of Ni/Pd/Au alloy, Ni/Pd alloy, Al/Ni/Cu alloy, Ti/Ni/Cu alloy, Ti/Cu alloy or Cu/Sn alloy.

5. The semiconductor package as claimed in claim 1, wherein the quantity of the inter-metallic compound formed between the middle material and the copper bonding wire is more than that formed between the aluminum pad and the copper bonding wire, and the quantity of the inter-metallic compound formed between the middle material and the aluminum pad is more than that formed between the aluminum pad and the copper bonding wire.

6. The semiconductor package as claimed in claim 5, wherein the bonding force between the middle material and the copper bonding wire is more than that between the aluminum pad and the copper bonding wire, and the bonding force between the middle material and the aluminum pad is more than that between the aluminum pad and the copper bonding wire.

7. The semiconductor package as claimed in claim 1, further comprising a passivating layer which covers the aluminum pad and exposes a part of the aluminum pad, whereby the aluminum pad has an outer area.

8. The semiconductor package as claimed in claim 7, wherein the covering area of the aluminum pad covered by the middle material is between 30% and 99% of the outer area of the aluminum pad.

9. The semiconductor package as claimed in claim 1, wherein the middle material has a top surface and includes at least one first pattern formed on the top surface of the middle material.

10. The semiconductor package as claimed in claim 9, wherein the copper bonding wire includes a block portion which has a bottom surface and at least one second pattern formed on the bottom surface of the block portion, and the second pattern is corresponding and bonded to the first pattern.

11. A wafer which defines a plurality of chips arranged in array manner, each chip comprising:
    at least one aluminum pad; and
    a middle material covering the aluminum pad and mounted on the aluminum pad, wherein the middle material is selected from the group consisting of nickel (Ni), vanadium (V) and titanium (Ti).

12. The wafer as claimed in claim 11, wherein each chip further comprising a passivating layer which covers the aluminum pad and exposes a part of the aluminum pad, whereby the aluminum pad has an outer area.

13. The wafer as claimed in claim 12, wherein the covering area of the aluminum pad covered by the middle material is between 30% and 99% of the outer area of the aluminum pad.

14. The wafer as claimed in claim 11, wherein the middle material is selected from the group consisting of tin (Sn), gold (Au), zinc (Zn), platinum (Pt), palladium (Pd), manganese (Mn), magnesium (Mg), indium (In), germanium (Ge) and silver (Ag).

15. The wafer as claimed in claim 11, wherein the middle material is an alloy selected from over one of the group consisting of nickel (Ni), vanadium (V), aluminum (Al), copper (Cu), titanium (Ti), tin (Sn), gold (Au), zinc (Zn), platinum (Pt), palladium (Pd), manganese (Mn), magnesium (Mg), indium (In), germanium (Ge) and silver (Ag).

16. The wafer as claimed in claim 15, wherein the alloy selected from the group consisting of Ni/Pd/Au alloy, Ni/Pd alloy, Al/Ni/Cu alloy, Ti/Ni/Cu alloy, Ti/Cu alloy or Cu/Sn alloy.

17. The wafer as claimed in claim 11, wherein the middle material has a top surface and includes at least one first pattern formed on the top surface of the middle material.

18. The wafer as claimed in claim 17, wherein the first pattern is a cavity.

19. The wafer as claimed in claim 18, wherein the depth of the cavity is smaller than the thickness of the middle material.

20. The wafer as claimed in claim 17, wherein the first pattern is a trench.

21. A semiconductor package comprising:
    a carrier;
    a chip disposed on the carrier, wherein the chip has a first surface and a second surface opposite to the first surface;
    an aluminum pad disposed on the first surface of the chip;
    a middle material covering the aluminum pad and mounted on the aluminum pad, wherein the middle material includes an adhesive layer and a plurality of electrically conductive particles disposed in the adhesive layer;
    a copper bonding wire bonded to the middle material; and
    a molding compound for sealing the chip and the copper bonding wire and covering the carrier.

* * * * *